United States Patent
Harrington et al.

(10) Patent No.: US 6,418,070 B1
(45) Date of Patent: Jul. 9, 2002

(54) MEMORY DEVICE TESTER AND METHOD FOR TESTING REDUCED POWER STATES

(75) Inventors: Matthew R. Harrington, Carrollton; Van C. Huynh; Adin E. Hyslop, both of Richardson, all of TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,566

(22) Filed: Sep. 2, 1999

(Under 37 CFR 1.47)

(51) Int. Cl.[7] .................................................. G11C 7/00
(52) U.S. Cl. ........................ 365/201; 365/226; 365/229; 365/228; 714/21; 714/22
(58) Field of Search ................. 365/201, 226, 365/227, 228, 229; 714/21, 22

(56) References Cited

U.S. PATENT DOCUMENTS 5,226,120 A * 7/1993 Brown et al. ............... 709/224
5,361,389 A * 11/1994 Fitch .......................... 395/375
5,606,664 A * 2/1997 Brown et al. ............... 709/224

* cited by examiner

Primary Examiner—Viet Q. Nguyen
(74) Attorney, Agent, or Firm—Schwegman, Lundberg, Woessner & Kluth, P.A.

(57) ABSTRACT

A memory device tester capable of testing for proper operation of reduced power states in memory devices. The memory device tester can include a processor or a state machine, each configured to send commands to the memory device, and to compare results. An example of a memory device that can be tested by the memory device tester is a Direct Rambus Dynamic Random Access Memory (DRDRAM). The described processing systems and other circuits can test a DRDRAM for proper operation in a standby (STBY) state. When the DRDRAM is in STBY, the column decoder is shut off to conserve power, and the DRDRAM should not respond to column packets on the column control bus. The DRDRAM Specification suggests that the DRDRAM be put in the STBY state with no banks active. The method and apparatus provide for testing that the column decoder is shut off when in STBY with no banks active, which is the recommended usage pattern for the part.

22 Claims, 6 Drawing Sheets

MEMORY DEVICE TESTER AND METHOD FOR TESTING REDUCED POWER STATES

TECHNICAL FIELD OF THE INVENTION

The present invention relates generally to the testing of electronic memory devices, and in particular, the present invention relates to testing of Direct Rambus Dynamic Random Access Memory (DRDRAM).

BACKGROUND OF THE INVENTION

Direct Rambus Dynamic Random Access Memories, hereinafter referred to as DRDRAMs, are very fast, highly pipelined memory devices that are becoming an industry standard in high speed processing systems. DRDRAMs include a considerable amount of internal circuitry that supports the pipelined architecture so as to provide for very high communication bandwidths at the device boundary. DRDRAM sustained data transfer rates exceed 1 GB/s.

DRDRAMs, like most commercially available memories, include memory cells that are arranged in rows and columns. Unlike many commercially available memories, however, DRDRAMs have rows gathered into banks of rows. This results in multiple banks within each DRDRAM, each including a number of rows. Gathering the rows of memory cells into banks allows rows in different banks to undergo separate operations simultaneously, thereby increasing the overall data transfer rate of the device.

Each bank is associated with one or more sense amplifiers that function to read data from, and write data to, the rows within the bank. The sense amplifiers serve as a data communications bridge between the banks of rows and the data buses external to the device. Banks are separately activated, possibly simultaneously, or overlapping in time, prior to a read or write operation. When a bank is activated, it communicates with one or more sense amplifiers. When the read or write operation is complete, the bank is deactivated, and the sense amplifiers are precharged, which essentially readies the sense amplifiers for another operation.

DRDRAMs include internal circuitry that controls, among other things, the data communication between banks and sense amplifiers, and the data communication between sense amplifiers and external data buses. The data communication between banks and sense amplifiers is generally controlled by a row decoder that is responsive to "row packets" received by the DRDRAM. The data communication between the sense amplifiers and external data buses is generally controlled by a column decoder that is responsive to "column packets."

A typical DRDRAM access is a multistep process. A bank and row is specified by a row command in a row packet, and then a column within the row is specified using a column command in a column packet. The sense amplifiers respond to the row command by copying the contents of the specified row from the activated bank into the sense amplifiers, and then respond to the column command by either: sending data to the external bus in the case of a read operation; or modifying the contents of the specified row in the activated bank in the case of a write operation.

DRDRAMs also have reduced power states. These states shut down portions of the device to save power. In the reduced power states, the contents of the memory array are saved, but other functions within the DRDRAM are shut down to conserve power. One such reduced power state is the Standby (STBY) state, in which the column decoder is shut down. When in STBY, the DRDRAM is ready to receive row packets, but will properly ignore any column packets received. DRDRAMs are put in STBY when given a relax (RLX) command in a row or column packet. Banks can be active when the RLX command is given (and the device is put in STBY), but this is not a likely usage pattern because this would put the device in STBY in the middle of an operation, and the purpose of the STBY state is to conserve power between operations. It is much more likely that the DRDRAM will have no banks active when the RLX command is given, because this will put the DRDRAM in STBY between operations rather than in the middle of an operation. This type of STBY state usage is clearly intended, as stated in the "Rambus Direct RDRAM 128/144-Mbit (256kx16/18x32s) Preliminary Information," Document DL0059, V1.0, May 1999, at page 39. The contents of the aforementioned document, which is hereinafter referred to as the "DRDRAM Specification," is hereby incorporated by reference.

When testing the proper operation of reduced power states in a DRDRAM, the test can include operations to verify that portions of the device that are supposed to be shut down in a given state are, in fact, shut down. In the case of the STBY state, the test can verify that the column decoder is shut down. One method of testing that the column decoder is shut down in the STBY state involves issuing a RLX command while a bank is active, performing a read operation, and checking to make sure that the data output from the DRDRAM is all zero. A data read operation resulting in all zeros is indicative of the column decoder being shut down because the sense amplifiers have been loaded by virtue of the active bank, but the sense amplifiers have not driven the data bus. If the column decoder was not shut down, a proper read operation would result in non-zero data being output.

One problem with this method of testing the STBY state is that a bank remains active during the test, which is not the normal usage of the device. As previously discussed, normal STBY usage of the part, as recommended in the DRDRAM specification, involves issuing a RLX command while the part has no active banks.

For the reasons stated above, and for other reasons stated below which will become apparent to those skilled in the art upon reading and understanding the present specification, there is a need in the art for alternate methods and apparatus for testing memory devices having reduced power states.

SUMMARY OF THE INVENTION

The above mentioned problems with proper DRDRAM testing and other problems are addressed by the present invention and will be understood by reading and studying the following specification.

In one embodiment, a method in a processing system that includes a memory device is described. The memory device has a row decoder, a column decoder, and rows and columns of memory cells. The method tests for the proper operation of a reduced power state in the memory device. The method includes issuing a first command adapted to cause the memory device to enter the reduced power state, wherein the command is decoded by one of the row decoder or the column decoder; issuing a second command to the memory device, wherein the second command is directed to the column decoder; and comparing a data value returned by the memory device against an expected value to verify that the column decoder did not decode the second command.

A computer-implemented method for testing a memory device is also described. The method includes generating a command adapted to cause the memory device to enter a reduced power state; driving the command onto a first control bus; generating a calibration sequence which includes at least one current calibration packet, wherein the at least one current calibration packet is adapted to cause the memory device to output a data value; driving a second control bus with the at least one current calibration packet; and comparing the data value with an expected value.

In another embodiment, an apparatus for testing a memory device having multiple banks is described. The memory device tester includes a control bus for coupling to the memory device, a data bus for coupling to the memory device, and a state machine coupled to the control bus. The state machine is configured to output commands on the control bus, and at least one of the commands is adapted to cause the memory device to output a data value on the data bus regardless of whether any of the multiple banks are active.

In another embodiment, an apparatus including a memory device having multiple banks is described. The apparatus further includes a control bus for coupling to the memory device, a data bus for coupling to the memory device, and a state machine coupled to the control bus. The state machine is configured to output commands on the control bus, and at least one of the commands is adapted to cause the memory device to output a data value on the data bus regardless of whether any of the multiple banks are active.

In another embodiment, a memory device tester is described. The memory device tester includes a receptacle for receiving a memory device, a control bus coupled to the receptacle for communicating with the memory device, and a processing unit coupled to the control bus for sending commands to the memory device. The commands sent to the memory device include a first command adapted to cause the memory device to enter a reduced power state, a first current calibration sequence including at least one current calibration (CAL) command, a second command adapted to cause the memory device to leave the reduced power state, and a second current calibration sequence including at least one current calibration (CAL) command.

In yet another embodiment, a memory interface for inclusion in an Application Specific Integrated Circuit (ASIC) is described. The memory interface includes a control bus for coupling to a memory device external to the ASIC, wherein the memory device includes banks of memory cells capable of being active or inactive. The memory interface also includes a data bus for coupling to the memory device and a state machine coupled to the control bus. The state machine is configured to output commands on the control bus, wherein at least one of the commands is adapted to cause the memory device to output a data value on the data bus regardless of whether any of the multiple banks are active.

In yet another embodiment, a machine readable medium is described. The medium is readable by an apparatus configured to test a memory device, and the machine readable medium includes instructions adapted to cause the apparatus to perform a method. The method includes generating a command within a first packet, wherein the command is adapted to cause the memory device to enter a reduced power state; driving a first control bus with the first packet; generating a calibration sequence within at least one current calibration packet, wherein the current calibration packet is adapted to cause the memory device to output a data value; driving a second control bus with the at least one current calibration packet; and comparing the data value with an expected value.

DETAILED DESCRIPTION OF THE INVENTION

Figure 1:
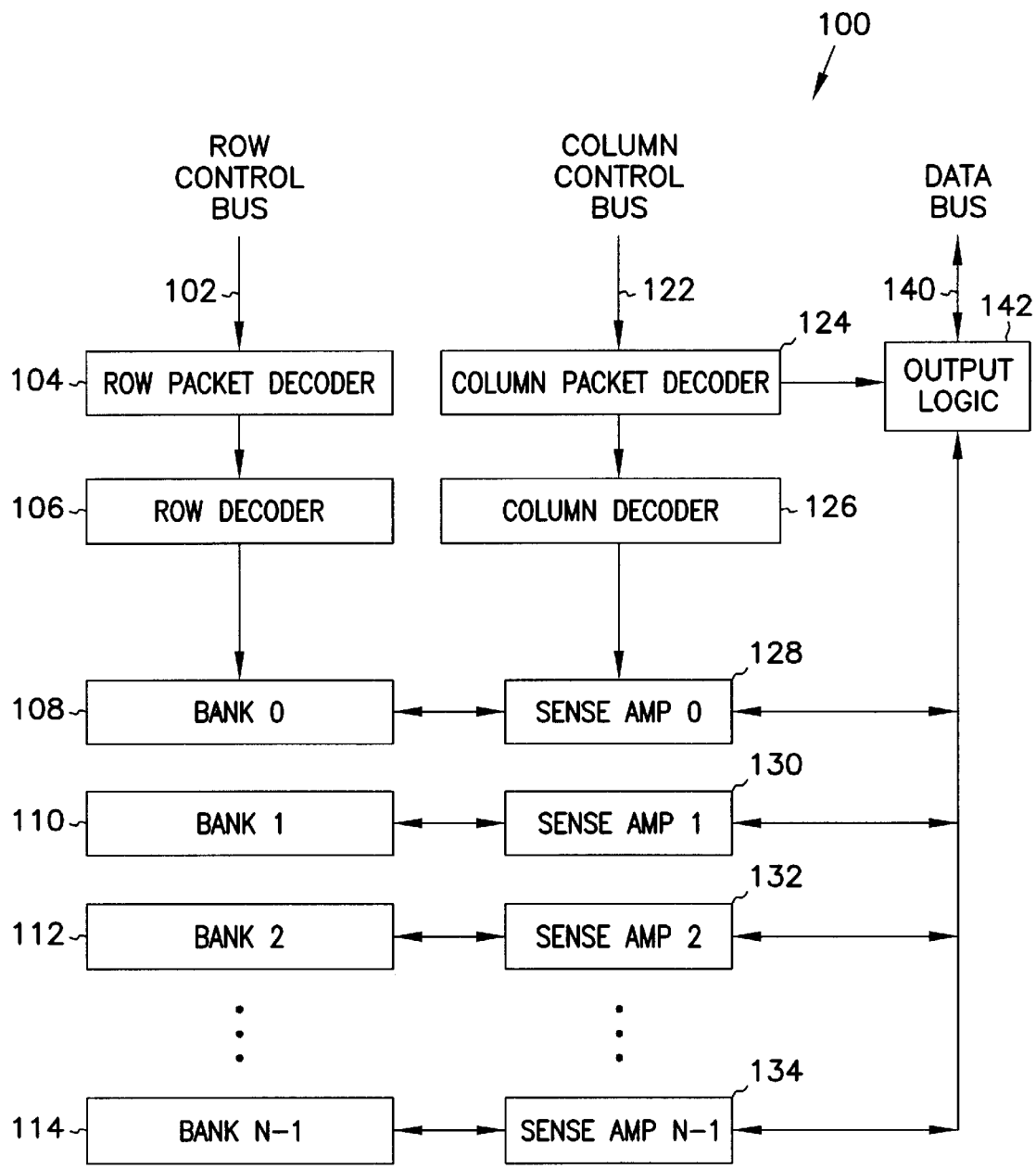
FIG. 1 is a simplified diagram of a Direct Rambus Dynamic Random Access Memory (DRDRAM)

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Memory Device

FIG. 1 shows a simplified diagram of a memory device. For exemplary purposes, the memory device of FIG. 1 is described as a DRDRAM, however, one skilled in the art will understand that other types memory devices can be substituted. As shown in FIG. 1, DRDRAM 100 includes row packet decoder 104, row decoder 106, column packet decoder 124, column decoder 126, and output logic 142. DRDRAM 100 also includes banks 108, 110, 112, and 114, and sense amplifiers 128, 130, 132, and 134. For exemplary purposes, the banks and sense amplifiers shown in FIG. 1 are numbered 0 to N−1 to signify the existence of N banks and N sense amplifiers within DRDRAM 100, where N is any number. In one embodiment, N is 32, and the banks and sense amplifiers are numbered from 0 to 31. Each of banks 108, 110, 112, and 114 include a number of rows, and each row includes a number of memory cells. As can be seen in FIG. 1, data bus 140 is coupled to output logic 142, which is in turn coupled to banks 108, 110, 112, and 114 through sense amplifiers 128, 130, 132, and 134. Output logic 142 can drive data onto data bus 140 and can receive data from data bus 140 and send it to sense amplifiers 128, 130, 132, and 134. Row control bus 102 is coupled to banks 108, 110, 112, and 114 through row packet decoder 104 and row decoder 106. Column control bus 122 is coupled to sense amplifiers 128, 130, 132, and 134 through column packet decoder 124 and column decoder 126.

Row packets are received on row control bus 102 and decoded by row packet decoder 104. The row packets are interpreted by row packet decoder 104, and contents thereof are selectively sent to row decoder 106 for further decoding. In the case when the row packet includes an activate (ACT) command, row decoder 106 activates a bank and selects a row within the activated bank. When the row is activated, the data contents currently saved in the row are loaded to the corresponding sense amplifier. For example, if an ACT command specifying bank 0, row 0, is received by row packet decoder 104, this information is passed to row decoder 106 which activates bank 0 (labeled 108 in FIG. 1), and causes the data contents of row 0, the first row in the activated bank, to be loaded into sense amplifier 0 (labeled 128 in FIG. 1). After receiving an ACT command, the bank is active, and the sense amplifier is loaded with data.

Column packets are received on column control bus 122 and decoded by column packet decoder 124. Column packet decoder 124 then selectively passes information from the column packet to column decoder 126 as necessary. For example, in the case of a read (RD) command, column decoder 126 causes one of the sense amplifiers to transmit data to output logic 142 which drives data bus 140. In the case of a write (WR) command, column decoder 126 causes data to pass from data bus 140 through output logic 142 to be written to one of the sense amplifiers.

As previously stated, DRDRAM 100 is capable of operating in reduced power states, one of which is standby (STBY). When in STBY, column decoder 126 is shut off to save power. If a column packet is received on column control bus 122 when DRDRAM is in STBY, the column packet is ignored.

Testing Memory Devices

Figure 2:
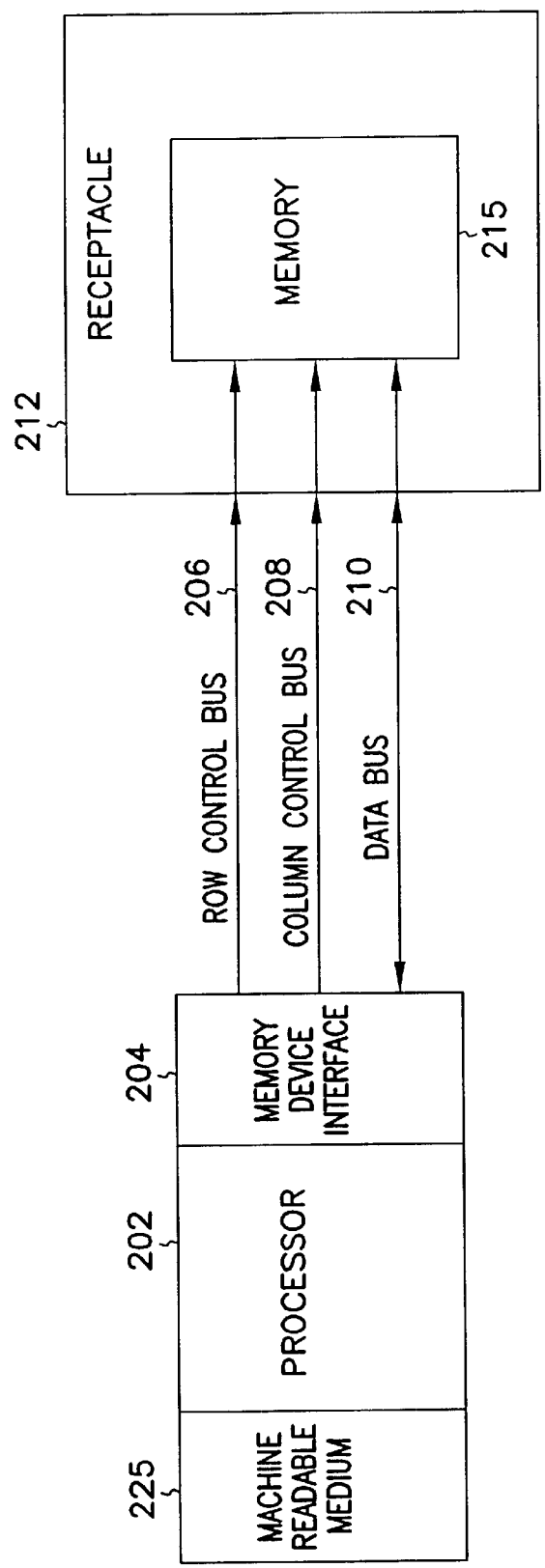
FIG. 2 is a processing system including a memory device tester.

FIG. 2 shows a processing system for testing memory devices such as DRDRAMs. The system includes processor 202 and receptacle 212. Receptacle 212 is capable of receiving memory device 215 either permanently or non-permanently. For example, receptacle 212 can be a socket that allows for insertion and removal of memory device 215, or receptacle 212 can be a set of pads on a printed circuit board intended to receive a soldered part such as a ball grid array (BGA) in a permanent fashion. In yet another embodiment, receptacle 212 is a connector capable of receiving a cable or other signal-carrying media that couples processor 202 to memory 215 when memory 215 is not physically proximate to processor 202.

Processor 202 further includes memory device interface 204. Processor 202 can be a commercially available processor such as a general purpose microprocessor, a digital signal processor, or the like. In an embodiment where processor 202 is a commercially available processor, memory device interface 204 is a separate, external memory controller, such as those available from Rambus, Inc. (Mountain View, Calif., USA). In this embodiment, processor 202 communicates with the external memory device interface 204 using address, data, and control signals, which are well known in the art and are not shown in FIG. 2.

In another embodiment, memory device interface 204 is part of, and internal to, processor 202. In this embodiment, processor 202 can be a custom processor designed specifically for the purpose of testing memory devices such as DRDRAMs. For example, in one embodiment memory device interface 204 is included within processor 202, and row control bus 206, column control bus 208, and data bus 210 couple processor 202 to receptacle 212. One manner of including memory device interface 204 within processor 202 is to utilize the application specific integrated circuit (ASIC) memory interface shown and described with reference to FIG. 6 below.

In one embodiment, the processing system of FIG. 2 is a test system intended for testing many memory devices. One application for this embodiment is in a production environment where many memory devices are tested in sequence as they are produced. FIG. 2 shows memory device 215, which is the device under test. In this embodiment, the processing system does not necessarily include memory device 215 because as a processing system for testing memory devices, it will often not have memory devices inserted in the receptacle. For example, in one particular embodiment, the processing system only includes processor 202, receptacle 212, and the interconnections between them exemplified by row control bus 206, column control bus 208, and data bus 210.

In another embodiment, the processing system of FIG. 2 is a complete end-user system, and memory device 215 is an integral part of the entire processing system. In this embodiment, memory device 215 remains inserted in receptacle 212, and memory device 215 is tested periodically, e.g., at system startup, by processor 202.

FIG. 2 also shows machine readable medium 225 coupled to processor 202. Machine readable medium 225 generally includes instructions for processor 202. For example, machine readable medium 225 can hold instructions for method 300, which is explained below with reference to FIG. 3. Machine readable medium 225 can be any type of media that can be read by processor 202. Examples include a floppy disk, hard disk, RAM, ROM, or network device. Machine readable medium 225 can be permanently affixed to processor 202, as in the case of a hard disk, or can be coupled to processor 202 for a limited time, as in the case of a floppy disk.

Figure 3:
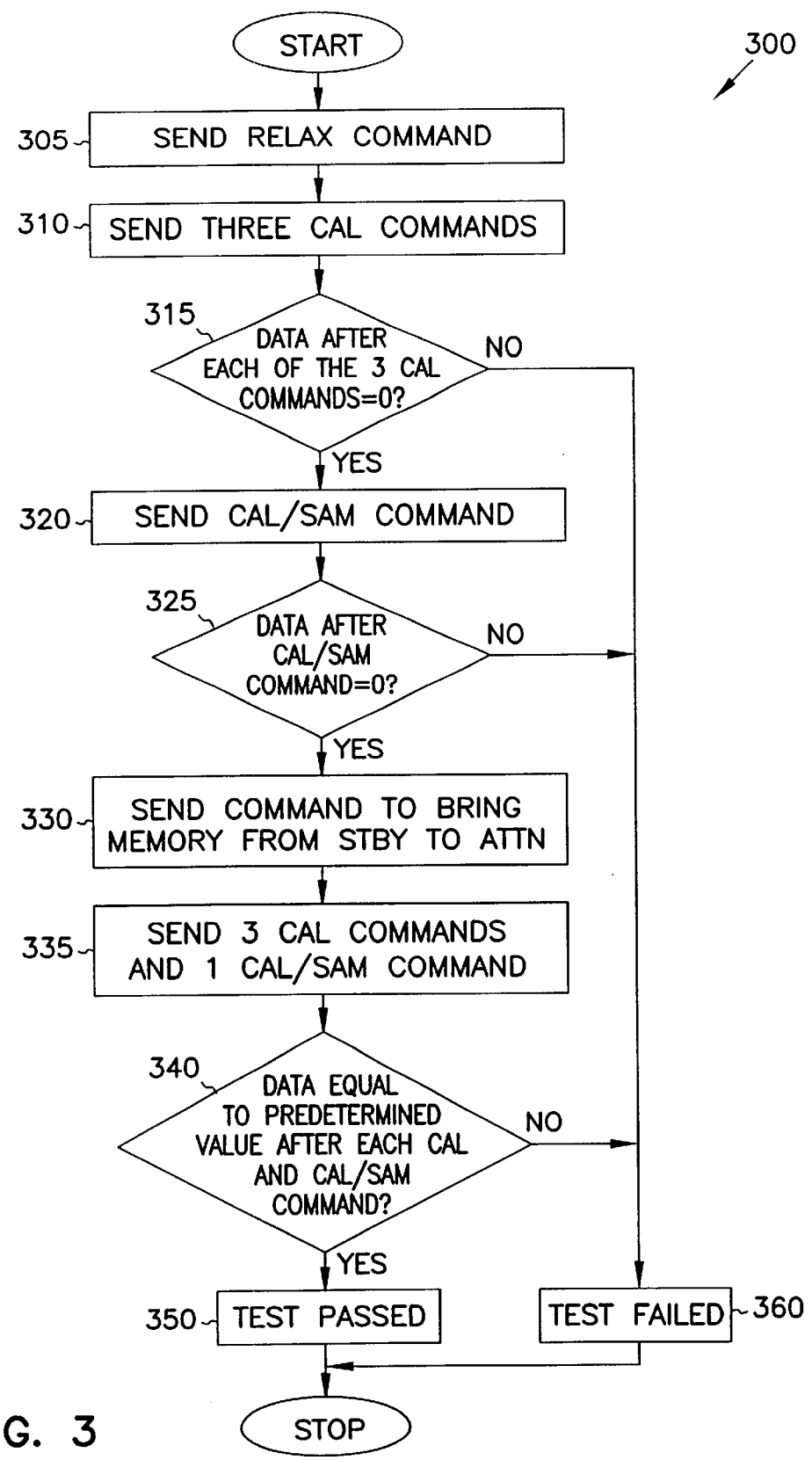
FIG. 3 is a flowchart of a process executed in the system of FIG. 2.

FIG. 3 shows a flowchart of method 300, which is a method performed by processor 202 of FIG. 2. Method 300 describes the use of a number of DRDRAM commands. Those commands are now described.

Relax (RLX) Command

The RLX command is a command that may be given in either a row packet or a column packet. When the RLX command is received, the DRDRAM enters the STBY state. When in the STBY state, the DRDRAM shuts off the column decoder to save power. The row decoder is still operative, and packets received on the row control bus are still decoded. The RLX command is described more fully in the DRDRAM Specification at pages 38 and 39.

Current Calibrate (CAL) Command

The CAL command calibrates the output-low current ($I_{OL}$) of the output drivers on the DRDRAM device. When a CAL command is received in a column packet, the DRDRAM broadcasts a calibration packet on the data bus. The $I_{OL}$ of the output drivers is calibrated periodically with a calibration sequence during operation of the DRDRAM. A calibration sequence generally includes three CAL commands followed by a CAL/SAM command. The CAL/SAM command is described in the next section. The CAL command is described more fully in the DRDRAM Specification at page 43.

Current Calibrate and Sample (CAL/SAM) Command

The CAL/SAM command is a packet that includes a CAL command and a sample (SAM) command. In response to the SAM command, the DRDRAM samples the last calibration packet, and adjusts the $I_{OL}$ value. The CAL/SAM command is described more fully in the DRDRAM Specification at page 43.

No Row Operation (NoRop) Command

The NoRop command is a command included within a row packet. The NoRop command does not cause an operation, but does cause the DRDRAM to exit STBY and go to the attention (ATTN) state. In the ATTN state, the DRDRAM is ready to receive packets on both the row control bus and the column control bus.

As previously stated, FIG. 3 shows a flowchart of a method for testing a memory device such as a DRDRAM. Method 300 can be a computer-implemented method implemented on a processing system, such as the processing system shown in FIG. 2. Additionally, instructions for method 300 can be included, in whole or in part, on a machine readable medium, such as machine readable medium 225 (FIG. 2). Referring now to the flowchart of FIG. 3, in action box 305, a RLX command is sent to a memory device which puts the memory device into the STBY state, a reduced power state in which the column decoder internal to the memory device is shut down. The RLX command of action box 305 can be sent to the memory device in either a row packet on the row control bus, or a column packet on the column control bus. Method 300 can send the RLX command to the memory device when no banks are active, and when all sense amplifiers are in a precharged state, although this is not necessary. By sending the RLX command when no banks are active, the memory device is put into the STBY state in a manner that is consistent with normal end-user usage patterns. When in STBY, the memory device should properly ignore any column packets received on the column control bus.

In action box 310, three CAL commands are sent to the memory device. More or less than three CAL commands can be utilized. For exemplary purposes, method 300 is specified with three CAL commands, so that a complete calibration sequence is used. In decision box 315, the data bus is sampled by the processing system after each CAL command is sent. If the memory device is in STBY in response to the RLX command of action box 305, the memory device will not decode the column packets that include the CAL commands, and as a result, will not drive the data bus with calibration packets. Accordingly, the data bus should be zero, which is the normal terminated state of an undriven data bus. This zero state is tested for in decision box 315. If the data bus does not reflect a data value of zero, the test fails and method 300 ends. If the test fails in this manner, then the column decoder within the memory device decoded the column packets that included the CAL commands, and drove the data bus as a result. In contrast, if the data bus reflects a data value of all zeros, this is indicative of an undriven bus, which results from the memory device not decoding the column packets. This is the desired condition because if the device is properly in STBY, column packets are not decoded, and the memory device will not drive calibration packets as a result of the CAL commands included within column packets on the column control bus. In the case of all zeros, method 300 continues from decision box 315 to action box 320.

In action box 320, method 300 causes a CAL/SAM command to be included within a column packet on the column control bus. The CAL/SAM command is included as part of a complete calibration sequence, but for the purposes of the present invention, the CAL/SAM command is not necessary. The CAL/SAM command is included after the three CAL commands of action box 310 so that a complete calibration sequence is performed while performing the test provided for by the method and apparatus of the present invention. In decision box 325, the data bus is sampled and checked for zero data values in the same manner as in decision box 315. If the memory device is properly in STBY, and the data values are zero, processing proceeds with action box 330. If the memory device drives the data bus, and is therefore not properly in STBY, the test fails and method 300 ends.

In action box 330, a command is sent to transition the memory device from the STBY state to the ATTN state. This transition is shown in the DRDRAM Specification in FIG. 45 on page 39. One command that will effect this transition is the NoRop command. This is a command included within a row packet on the row control bus. When the memory device receives the NoRop command, the device transitions to the ATTN state from the STBY state, and the column decoder is turned on as a result. When in the ATTN state, the memory device is ready to receive and decode both row packets and column packets on the row control bus and column control bus respectively.

After returning the memory device to the ATTN state as previously described, a calibration sequence is sent by the processing system as shown in action box 335. Again, an entire calibration sequence, that is, three CAL commands followed by a CAL/SAM command, is not necessary. One or more CAL or CAL/SAM commands is sufficient. In decision box 340, data values present on the data bus are sampled by the processing system, and the sampled data values are compared against a predetermined value. The data values that should be present on the data bus are the contents of the calibration packets driven onto the data bus by the memory device. In one embodiment, the data value that should be present is 000x01000b, expressed in binary, where x is either a 1 or a 0. The contents of the data value are explained with reference to FIG. 51 in the DRDRAM Specification at page 43. If the comparison does not result in a match, then the test fails as shown in action box 360, and method 300 ends. If, however, the comparison results in a match, then the test passes, as shown in action box 350.

Method 300 has been described with CAL and CAL/SAM commands as the commands used to test that the memory device is properly in the STBY state. One skilled in the art will understand that other commands can be used, where those commands are included in column packets, and are commands configured to cause the memory device to drive known data values on the data bus when not in STBY, and regardless of whether any banks are active. Commands having these characteristics allow the memory device to be tested while in the STBY state with no banks active, which is the normal operation of the STBY state.

Figure 4:
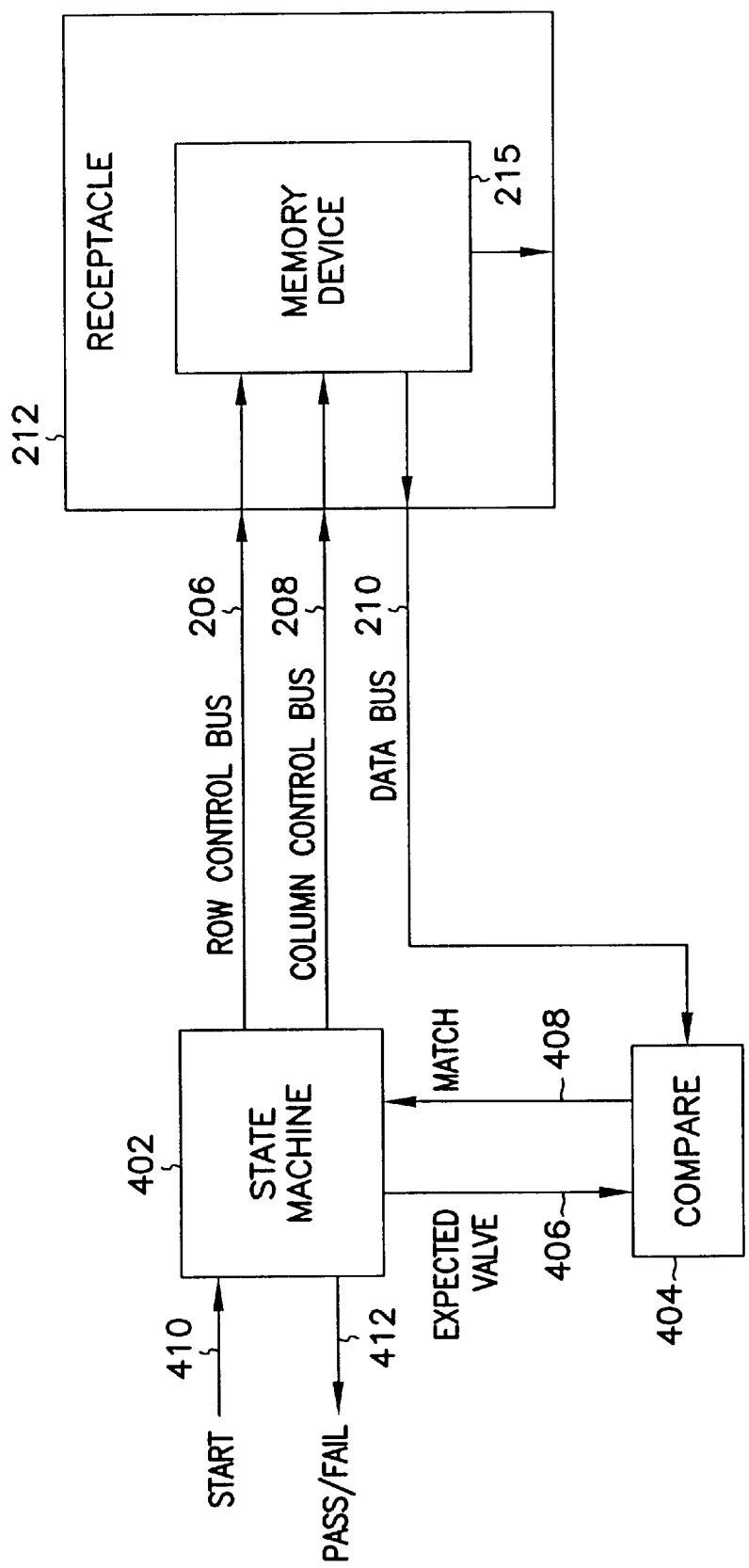
FIG. 4 is an alternate processing system including a memory device tester.

FIG. 4 shows an alternate processing system for testing a memory device. The alternate processing system of FIG. 4 includes state machine 402 which drives data on row control bus 206 and column control bus 208. State machine 402 receives a "match" signal on signal path 408 from compare circuit 404, and a "start" signal on signal path 410. Additionally, state machine 402 drives an "expected value" signal on bus 406, that is received by compare circuit 404. Receptacle 212, memory device 215, row control bus 206, column control bus 208, and data bus 210 are the same as those described with reference to FIG. 2. The operation of the alternate processing system shown in FIG. 4 is described with reference to FIG. 5.

Figure 5:
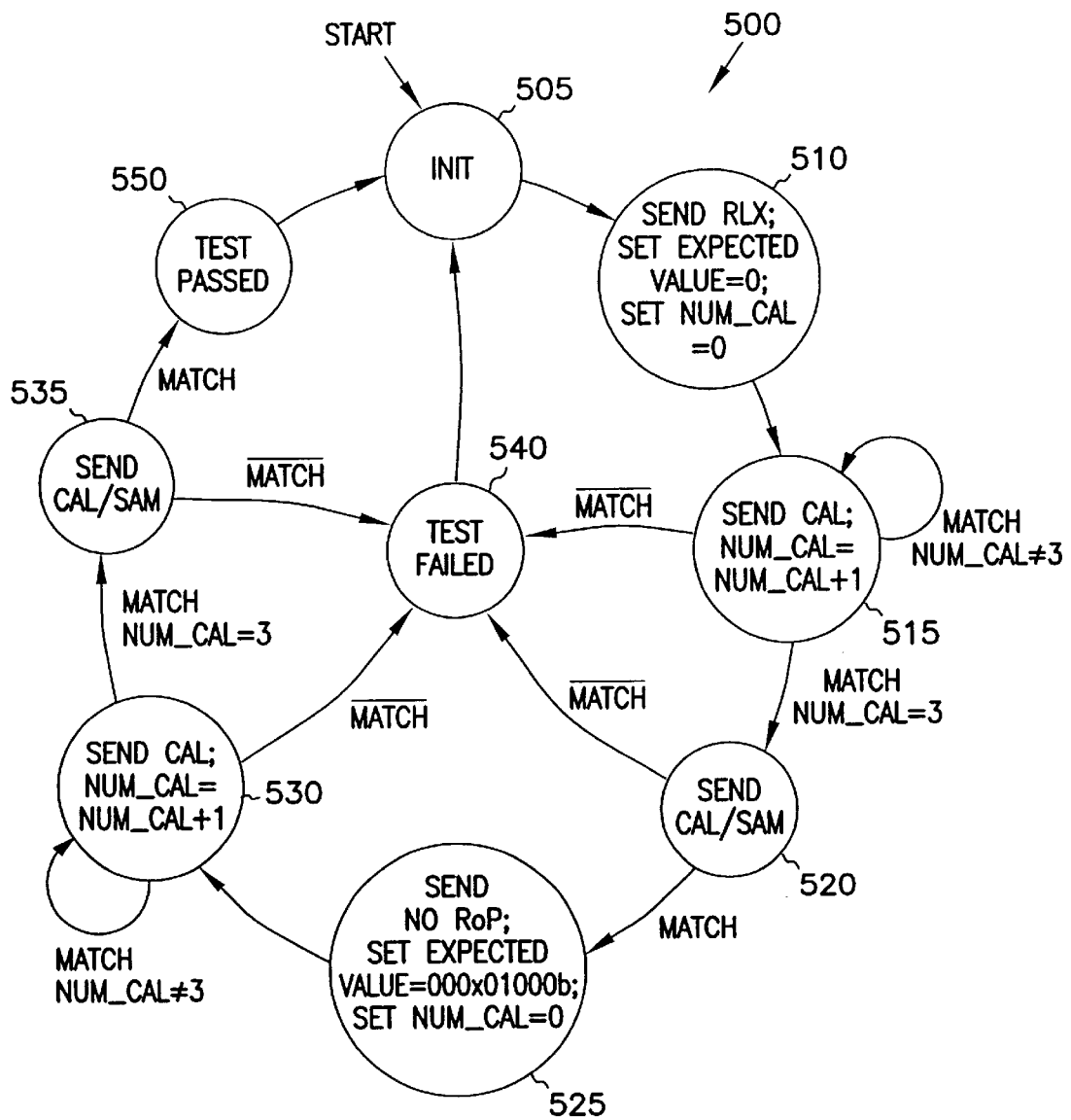
FIG. 5 is a state diagram showing states executed by the processing system of FIG. 4.

FIG. 5 is a state diagram showing the states executed by the processing system of FIG. 4. State diagram 500 begins with the Init state 505. When a start signal is received, state 510 is entered from state 505. This corresponds to a start signal on signal path 410 (FIG. 4). In state 510, a RLX command is sent to the memory device; the expected value is set to zero; and the internal variable "num_cal" is set to zero. The RLX command puts the memory device in STBY as previously described; setting the expected value to zero corresponds to state machine 402 driving bus 406 with all zeros; and the internal variable num_cal is used to track the number of CAL commands sent to the memory device. The state machine transitions from state 510 to state 515, where a CAL command is sent to the memory device in a column packet on the column control bus. Also in state 515, the internal variable num_cal is incremented, which keeps track of the number of CAL commands sent. The state machine remains in state 515 until num_cal is equal to three, which occurs when three CAL commands have been sent. As before, some number of CAL commands other than three is permissible. The state machine then transitions to state 520, where a CAL/SAM packet is sent.

During both states 515 and 520, compare circuit 404 is comparing the expected value with the data contents of data bus 210 during the time that calibration packets would be driven on data bus 210 in response to the CAL commands. Since the expected value is set to zero in these states, if the data bus contents are not zero, compare circuit 404 will report no match, and state machine 402 will transition to state 540 which reports that the test has failed. One mechanism to report the test failed is to assert the pass/fail signal on signal path 412. If matches have been found during states 515 and 520, state 525 will be entered.

In state 525, a NoRop command is sent the memory device in a row packet; the expected value is set to 000x01000b, and num_cal is set to zero. The NoRop command brings the memory device to ATTN from STBY; the expected value is set to the expected contents of the calibration packets; and num_cal is again used to track the number of CAL commands sent. For exemplary purposes, the embodiment shown in state 525 includes a NoRop command and expected value of 000x01000b. One skilled in the art will understand that other commands configured to change the state of the memory device can be substituted for the NoRop command. Those skilled in the art will further understand that the expected value is not limited to the exemplary value of 000x01000b, but rather that the expected value can be set to any value that is expected from the particular memory device being tested.

States 530 and 535 are analogous to states 515 and 520, respectively, in that they send three CAL commands followed by a CAL/SAM command. If a match is not found by compare circuit 404 during states 530 and 535, that is, if the calibration packets driven on data bus 210 by memory device 215 in response to the CAL commands do not include the data value 000x01000b, state 540 is entered, and the test fails. If the calibration packets do include the expected data value, then state 550 is entered, and the test passes.

State diagram 500 has been described with CAL and CAL/SAM commands as the commands used to test that the memory device is properly in the STBY state. One skilled in the art will understand that other commands can be used, where those commands are included in column packets, and are commands configured to cause the memory device to drive known data values on the data bus when not in STBY, and regardless of whether any banks are active. Commands having these characteristics allow the memory device to be tested while in the STBY state with no banks active, which is the normal operation of the STBY state.

Figure 6:
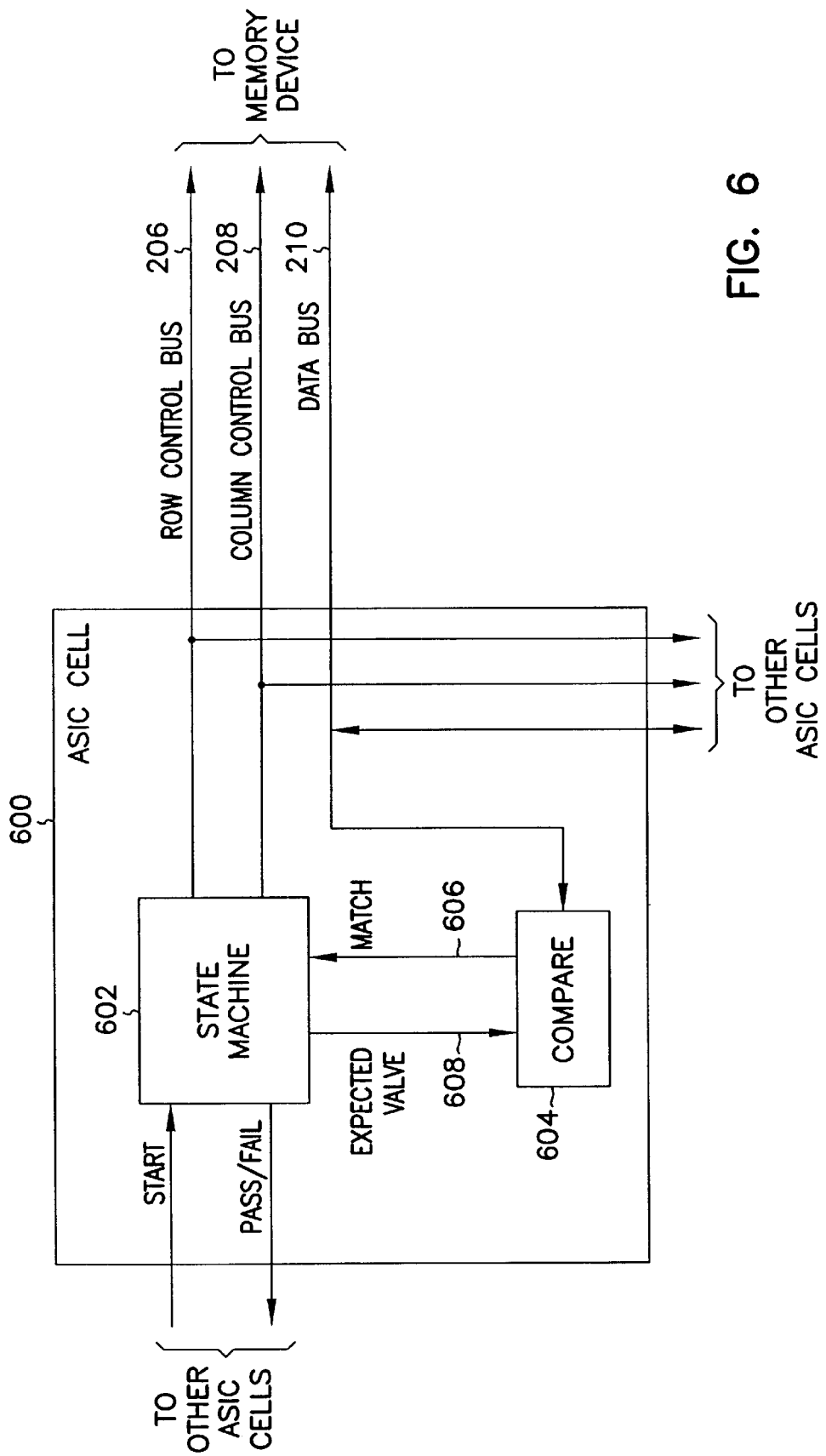
FIG. 6 is a memory interface for inclusion in an application specific integrated circuit.

FIG. 6 shows a memory interface for inclusion in an Application Specific Integrated Circuit (ASIC). ASIC cell 600 includes state machine 602 and compare block 604. The interface between ASIC cell 600 and the rest of the device that incorporates ASIC cell 600 includes a start signal, a pass/fail signal, a row control bus 206, a column control bus 208, and a data bus 210. State machine 602 communicates with compare circuit 604 using a match signal on signal path 606 and an expected value signal on bus 608. State machine 602 operates in a manner similar to state machine 402 (FIG. 4) which is described in FIG. 5.

ASIC cell 600 can be a soft macro specified in a hardware design language such as VHDL or Verilog, such that it can be synthesized into an ASIC in a process-independent manner. ASIC cell can also be a hard macro that is well-specified for use in a particular manufacturing process.

Conclusion

A memory device tester and method therefor have been described. The processing systems and other circuits test a memory device such as a DRDRAM for proper operation in a STBY state. When the memory device is in STBY, the column decoder is shut off to conserve power, and the memory device should not respond to column packets on the column control bus. The DRDRAM Specification suggests that the memory device be put in the STBY state with no banks active. The method and apparatus of the present invention provide for testing that the column decoder is shut off when in STBY with no banks active, which is the recommended usage pattern for the part.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus for testing a memory device having at least one bank, the apparatus comprising:
  a control bus for coupling to the memory device;
  a data bus for coupling to the memory device; and
  a state machine coupled to the control bus, the state machine being configured to output a plurality of commands on the control bus, wherein at least one of the commands is adapted to cause the memory device to output a data value on the data bus regardless of whether any of the at least one banks is active.

2. The apparatus of claim 1 wherein the control bus is a column control bus, and at least one of the plurality of commands is adapted to put the memory device in a reduced power state.

3. The apparatus of claim 1 wherein the control bus is a row control bus, and at least one of the plurality of commands is adapted to put the memory device in a reduced power state.

4. The apparatus of claim 1 wherein the control bus is a column control bus, and at least one of the plurality of commands is a current calibrate (CAL) command.

5. The apparatus of claim 1 further comprising a receptacle configured to receive the memory device, wherein the receptacle is coupled to the control bus and to the data bus.

6. The apparatus of claim 1 wherein the state machine is further configured to compare the data value with an expected value.

7. The apparatus of claim 1 wherein the control bus is a row control bus, and the wherein the apparatus further comprises:

a column control bus for coupling to the memory device; and a receptacle for receiving the memory device, wherein the receptacle is coupled to the row control bus, column control bus, and data bus.

8. The apparatus of claim 7 wherein the state machine is additionally configured to output a plurality of column commands on the column control bus, and at least one of the plurality of column commands is a current calibrate (CAL) command.

9. The apparatus of claim 8 wherein the state machine is configured to:

output on either of the row control bus or the column control bus a relax (RLX) command; and output on the column control bus a calibration sequence comprising at least three CAL commands.

10. The apparatus of claim 1 wherein:

the memory device is a Direct Rambus Dynamic Random Access Memory; and at least one of the plurality of commands is a relax (RLX) command which puts the Direct Rambus Dynamic Random Access Memory in a standby (STBY) state.

11. An apparatus comprising:

a memory device having multiple banks, a control bus coupled to the memory device;

a data bus coupled to the memory device; and a state machine coupled to the control bus, the state machine being configured to output a plurality of commands on the control bus, wherein at least one of the commands is adapted to cause the memory device to output a data value on the data bus regardless of whether any of the multiple banks are active.

12. The apparatus of claim 11 wherein the control bus is a column control bus, and at least one of the plurality of commands is adapted to put the memory device in a reduced power state.

13. The apparatus of claim 11 wherein the control bus is a row control bus, and at least one of the plurality of commands is adapted to put the memory device in a reduced power state.

14. The apparatus of claim 11 wherein the control bus is a column control bus, and at least one of the plurality of commands is a current calibrate (CAL) command.

15. A memory interface for inclusion in an application specific integrated circuit (ASIC), the memory interface comprising:

a control bus for coupling to a memory device external to the ASIC, wherein the memory device includes banks of memory cells capable of being active or inactive;

a data bus for coupling to the memory device; and a state machine coupled to the control bus, the state machine being configured to output a plurality of commands on the control bus, wherein at least one of the commands is one which is adapted to cause the memory device to output a data value on the data bus regardless of whether any of the multiple banks are active.

16. The memory interface of claim 15 wherein the control bus is a column control bus, and at least one of the plurality of commands is adapted to put the memory device in a reduced power state.

17. The memory interface of claim 15 wherein the control bus is a row control bus, and at least one of the plurality of commands is adapted to put the memory device in a reduced power state.

18. The memory interface of claim 15 wherein the control bus is a column control bus, and at least one of the plurality of commands is a current calibrate (CAL) command.

19. The memory interface of claim 15 further comprising a receptacle configured to received the memory device, wherein the receptacle is coupled to the control bus and to the data bus.

20. The memory interface of claim 15 wherein the state machine is further configured to compare the data value with an expected value.

21. The memory interface of claim 15 wherein:

the control bus is a column control bus:

the state machine is additionally configured to output a plurality of column commands on the column control bus; and at least one of the plurality of column commands is a current calibrate (CAL) command.

22. The memory interface of claim 21 further comprising a row control bus for coupling to the memory device, wherein the state machine is further configured to:

output on either of the row control bus or the column control bus a relax (RLX) command; and output on the column control bus a calibration sequence comprising at least three calibrate (CAL) commands.

* * * * *